United States Patent
Klass et al.

(10) Patent No.: US 7,411,409 B2
(45) Date of Patent: Aug. 12, 2008

(54) DIGITAL LEAKAGE DETECTOR THAT DETECTS TRANSISTOR LEAKAGE CURRENT IN AN INTEGRATED CIRCUIT

(75) Inventors: Edgardo F. Klass, Palo Alto, CA (US); Andrew J. Demas, Los Altos, CA (US); Greg M. Hess, Mountain View, CA (US); Ashish R. Jain, Mountain View, CA (US)

(73) Assignee: P.A. Semi, Inc., Santa Clara, CA (US)

( * ) Notice: Subject to any disclaimer, the term of this patent is extended or adjusted under 35 U.S.C. 154(b) by 117 days.

(21) Appl. No.: 11/281,110

(22) Filed: Nov. 17, 2005

(65) Prior Publication Data

US 2007/0109006 A1 May 17, 2007

(51) Int. Cl.
  *G01R 31/26* (2006.01)
(52) U.S. Cl. .................... 324/765; 324/763
(58) Field of Classification Search ......... 324/763–765, 324/158.1; 702/117; 714/724, 730–73; 327/524; 326/93–94, 98
  See application file for complete search history.

(56) References Cited

U.S. PATENT DOCUMENTS

| | | | |
|---|---|---|---|
| 4,862,070 A * | 8/1989 | Ostertag | 324/73.1 |
| 5,132,929 A | 7/1992 | Ochii | |
| 5,757,203 A * | 5/1998 | Brown | 324/765 |
| 5,912,562 A * | 6/1999 | Pappert et al. | 324/765 |
| 5,936,902 A | 8/1999 | Hsu et al. | |
| 6,005,406 A * | 12/1999 | Storino et al. | 324/763 |
| 6,262,585 B1 * | 7/2001 | Frodsham et al. | 324/763 |
| 7,038,483 B1 | 5/2006 | Suzuki et al. | |
| 7,078,767 B2 | 7/2006 | Ipposhi et al. | |

* cited by examiner

*Primary Examiner*—Vinh P Nguyen
(74) *Attorney, Agent, or Firm*—Lawrence J. Merkel; Meyertons, Hood, Kivlin, Kowert & Goetzel, P.C.

(57) ABSTRACT

In one embodiment, an integrated circuit includes at least one digital leakage detector that includes digital circuitry configured to detect an approximation of a magnitude of the leakage current in transistors of the integrated circuit and configured to generate a digital output representing the approximated magnitude. In another embodiment, a leak detector includes leak circuits and clocked storage devices. Each leak circuit is configured to generate an output signal indicative of a different magnitude of leakage current in a transistor. The clocked storage devices are configured to capture a state representing the output signals of the leak circuits. In another embodiment, a method includes running a test for leakage current in a digital leakage detector, wherein a digital output of the digital leakage detector represents a magnitude of a leakage current being experienced by the integrated circuit during use; and outputting the digital output from the integrated circuit.

21 Claims, 3 Drawing Sheets

US 7,411,409 B2

DIGITAL LEAKAGE DETECTOR THAT DETECTS TRANSISTOR LEAKAGE CURRENT IN AN INTEGRATED CIRCUIT

BACKGROUND

1. Field of the Invention

This invention is related to the field of integrated circuits and, more particularly, to leakage current detection in integrated circuits.

2. Description of the Related Art

Integrated circuits are manufactured using a semiconductor manufacturing process appropriate for the semiconductor substrate material being used and appropriate for the types of transistors being fabricated. For example, complementary metal-oxide-semiconductor (CMOS) transistors fabricated in silicon substrates are very popular in industry today. Other semiconductor substrates may include, e.g., galium arsenide (GaAs), silicon on insulator (SOI), etc. Other transistors may include bipolar junction transistors (BJTs), other types of field effect transistors (FETs), etc.

The semiconductor manufacturing process is complex, and subject to numerous adjustments that affect the performance of the transistors fabricated using the process. Processes are often described as running "hot" (transistors having more rapid switching qualities) or "cold" (transistors having less rapid switching qualities). A variety of specifications are agreed to between the foundry that implements the process and the designer that designs the integrated circuit.

One specification that has risen in importance as the feature sizes in processes have continued to shrink is the leakage current specification. Leakage current may generally refer to the current through a transistor when the transistor is logically inactive (or logically non-conductive) according to the control node voltage and/or control current of the transistor. For example, in CMOS transistors, the transistor is logically inactive/logically non-conductive if the gate voltage is lower than the source voltage (for N-type MOS (NMOS) transistors) or if the gate voltage is higher than the source voltage (for P-type MOS (PMOS) transistors). Leakage current may occur from a variety of sources. For example, in CMOS transistors, leakage current may occur through the oxide from the gate to source or drain, from the source to the drain (over a short channel), etc. There may be numerous sources of leakage current in a given transistor.

Leakage current is typically much smaller in magnitude than the magnitude of the active current that flows through a transistor when the transistor is logically active (or conductive), by several orders of magnitude. However, the leakage current contributes to the static power consumption of an integrated circuit and thus may contribute to high power consumption even though the magnitude of the leakage current is fairly small. Accordingly, a specification for low leakage current is desirable. Leakage current is affected by the various process parameters in the semiconductor manufacturing process, as well as by operating temperature during operation of the integrated circuit. Leakage current can vary across a semiconductor wafer as well.

Currently, the foundry supplies leakage current data for a given wafer to the designer. The leakage current is measured from small amounts of circuitry in the "scribe" area of the wafer (the area between chips on the wafer, where cuts are made during the dicing process to divide the wafer into individual chips). Unfortunately, the leakage current measurements are typically taken from relatively few sites on the wafer, and thus variations across the wafer may not be accurately captured. Additionally, there are physical differences between the scribe area and the chips themselves, which may impact the accuracy of the scribe leakage current measurements with respect to the chips. Still further, the scribe circuits are very small, and thus the magnitude of the leakage current being measured is also very small. The low magnitude increases the challenge of getting accurate leakage current measurements.

SUMMARY

In one embodiment, an integrated circuit comprises at least one digital leakage detector. The digital leakage detector comprises digital circuitry configured to detect an approximation of a magnitude of the leakage current in transistors of the integrated circuit, and configured to generate a digital output representing the approximated magnitude.

In another embodiment, a leak detector comprises a plurality of leak circuits and a plurality of clocked storage devices. Each leak circuit is configured to generate an output signal indicative of a different magnitude of leakage current in a transistor of an integrated circuit, and the clocked storage devices are configured to capture a state representing the output signals of the plurality of leak circuits.

In yet another embodiment, a method comprises running a test for leakage current in a digital leakage detector within an integrated circuit, wherein a digital output of the digital leakage detector represents a magnitude of a leakage current being experienced by the integrated circuit during use; and outputting the digital output from the integrated circuit.

BRIEF DESCRIPTION OF THE DRAWINGS

The following detailed description makes reference to the accompanying drawings, which are now briefly described.

Figure 1:
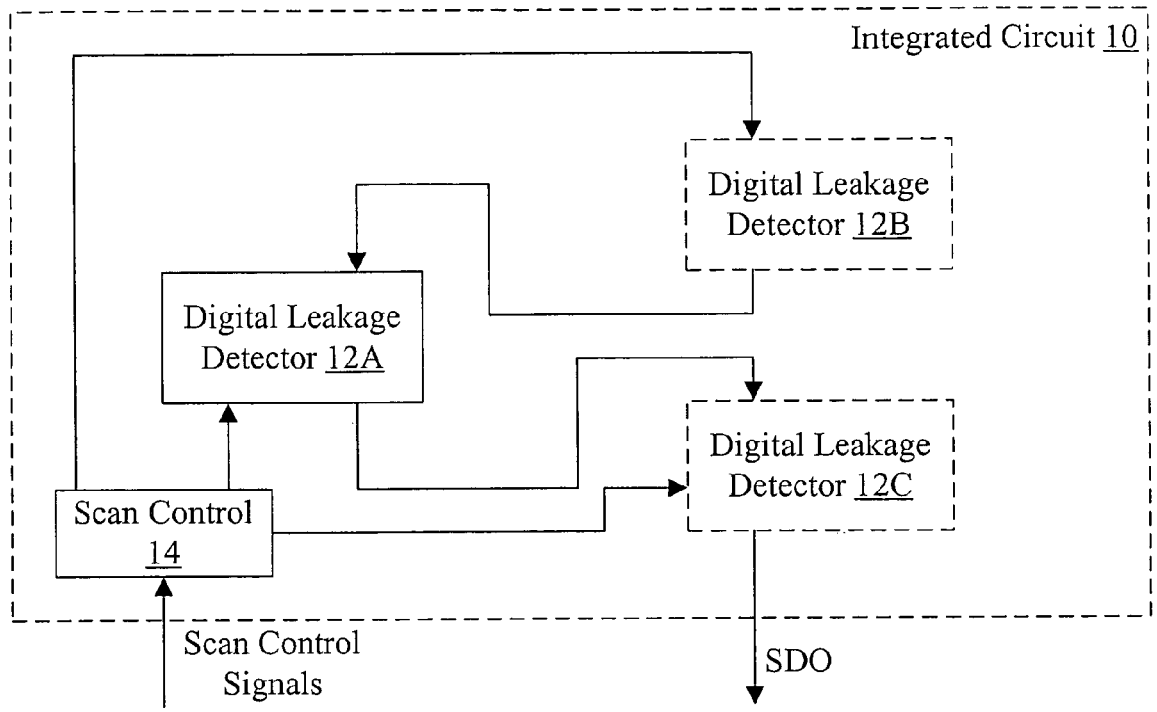
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown. In the illustrated embodiment, the integrated circuit 10 includes at least one digital leakage detector 12A, and may include a plurality of digital leakage detectors (e.g. 12A-12C in FIG. 1). Any number of one or more digital leakage detectors may be used in various embodiments. The integrated circuit 10 also includes a scan control unit 14. The scan control unit 14 is coupled to receive various scan control signals from a source external to the integrated circuit (e.g. another component of the system that includes the integrated circuit 10, not shown in FIG. 1). Additionally, the scan control unit 14 is coupled to the digital leakage detectors 12A-12C. The digital leakage detectors 12A-12C may be coupled into a scan chain (e.g. from digital leakage detector 12B to digital leakage detector 12A to digital leakage detector 12C to the scan data out (SDO) output of the integrated circuit 10, in the illustrated embodiment) to permit leakage current measurement results to be scanned out of the digital leakage detectors 12A-12C for observation external to the integrated circuit 10. Alternatively, one or more of the digital leakage detectors 12A-12C may be included in separate scan chains (e.g. with core logic circuitry, not shown in FIG. 1). There may also be a scan data input at the head of the scan chain, which may not be used by the digital leakage detectors 12A-12C (the scan in data may be a don't care), but could be used by core circuitry included in the scan chain.

In one embodiment, the digital leakage detectors 12A-12C may comprise digital circuitry configured to detect an approximation of the magnitude of the leakage current in the integrated circuit 10, and may generate a digital output that represents the detected magnitude of the leakage current. The magnitude of the leakage current may be approximated relative to the active current in the transistors. Since the digital leakage detectors 12A-12C are included in the integrated circuit 10, rather than the scribe of the wafer, the digital leakage circuits may not be affected by differences in the scribe and the integrated circuit, in some embodiments. Additionally, the digital leakage circuits may be used at any time, not just during manufacturing, to measure leakage current. The digital leakage detectors 12A-12C may more accurately reflect the individual integrated circuit 10, rather than the wafer that originally contained the integrated circuit as a whole. In some embodiments, if multiple leakage detectors are included at various physical points within the integrated circuit 10, variations across the integrated circuit chip may even be detected.

In one embodiment, the result from a given digital leakage detector 12A-12C may comprise a bit vector (also referred to as a vernier). Each bit in the bit vector may represent a different possible leakage current magnitude (or approximation thereof). More particularly, in one embodiment, each bit may correspond to a leak circuit that includes an active transistor and an inactive transistor, where the width parameter of the inactive transistor is a multiple of the width parameter of the active transistor. If the magnitude of the leakage current of the inactive transistor is comparable to the magnitude of the active current of the active transistor (or greater), the leak circuit may output one digital value (e.g. a binary one), and if the leakage current is not comparable to the active current, the leak circuit may output another digital value (e.g. binary zero). Thus, the bit vector may include at most one transition (e.g. from zero to one) at which the inactive transistor's leakage current becomes comparable to the active current. Accordingly, the bit vector may represent the magnitude of the leakage current. The actual leakage current may be derived from the multiple of the width parameter used in the leak circuit corresponding to the bit at which the transition occurs. Alternatively, the output values of the digital leakage detector may be characterized into those that meet specification for leakage current and those that do not. Depending on the group into which a given output falls, the leakage current may either meet specification or not meet specification.

The leakage current may be comparable to the active current, in various embodiments, in different fashions. For example, if the magnitudes of the currents are within an order of magnitude of each other, the leakage current may be viewed as comparable to the active current. The leakage current may be comparable if it is approximately equal to the active current. In one particular implementation, the leakage current may be comparable if the leakage current is high enough to overcome the active current on the input of a logic circuit and thus is able to change a state of the logic circuit's output from the state that would exist without leakage current. Other embodiments may implement different formats for the output (e.g. a numerical value).

The width parameter may be any parameter describing a transistor that indicates the size of the transistor (and thus indirectly indicates its current capacity). For example, CMOS transistors are often defined to have a minimum channel length for a given semiconductor manufacturing process, with variations in channel width used to vary current capacity.

In one embodiment, multiple digital leak detectors 12A-12C may be included to test leakage currents for transistors having standard threshold voltage (SVT), high threshold voltage (HVT) relative to SVT, and low threshold voltage (LVT) relative to SVT. The SVT transistors may be the transistors that are typically used in the integrated circuit. HVT transistors may be used for power savings in circuits where speed is less critical. HVT transistors have a higher threshold voltage (the voltage difference between the gate and the source before substantial active current flow begins) and thus may also react more slowly to a transition on a gate signal. However, HVT transistors also have lower leakage currents (e.g. about 10× lower than SVT transistors). Conversely, LVT transistors are often used where speed is paramount. LVT transistors have lower threshold voltage, and thus react quickly to a transition on the gate signal, but also have higher leakage currents (e.g. about 10× higher than SVT transistors). In one embodiment, multiple digital leak detectors 12A-12C may be included to allow for leakage current testing on multiple transistor types (e.g. PMOS and NMOS leakage current testing). In one embodiment, multiple leakage detectors 12A-12C may be included to test LVT, SVT, and HVT transistors of each type (e.g. at least 6 digital leak detectors to test the above for PMOS and for NMOS).

As mentioned above, the scan control unit 14 may be used to scan out results from the digital leakage detectors 12A-12C. The scan control unit 14 may implement any scan interface (e.g. the test access port (TAP) specified in Institute of Electrical and Electronic Engineers (IEEE) standard 1149.1; level sensitive scan design (LSSD); etc.). The scan interface is represented in FIG. 1 as the scan control signals and SDO. Typically, the interface may include a scan clock, scan enable, scan data input (SDI), scan data output (SDO), etc. In some cases, portions of the scan interface may be connected directly to the digital leakage detectors 12A-12C (e.g. the SDI, the SDO, the scan clock). In other cases, the scan control unit 14 may not be required.

In one embodiment, the scan control unit 14 is configured to establish a mode in the digital leakage detectors 12A-12C prior to initiating a test by the digital leakage detectors 12A-12C and scanning out the result. Various modes may be supported. For example, an accumulate (or set/resettable) mode may be supported in which a given bit in the vector may be set at any point in the test (e.g. at any given clock cycle) and remains set until explicitly reset. In such a mode, a worst case analysis may be performed over multiple clock cycles. Additionally, a sample mode may be supported in which the bit vector represents the sampled state on the most recent clock cycle. Other modes may be supported in other embodiments.

In other embodiments, the output of the digital leak detectors 12A-12C may be provided using other mechanisms than scan. For example, the output may be directly provided on output pins of the integrated circuit 10. Alternatively, the output may be provided to other circuitry in the integrated circuit 10 for transmission out of the integrated circuit 10 (e.g. broadcast on an interface of the integrated circuit 10). The output may also be written to registers in the integrated circuit 10 or memory in the integrated circuit 10 that may be readable in software.

Figure 2:
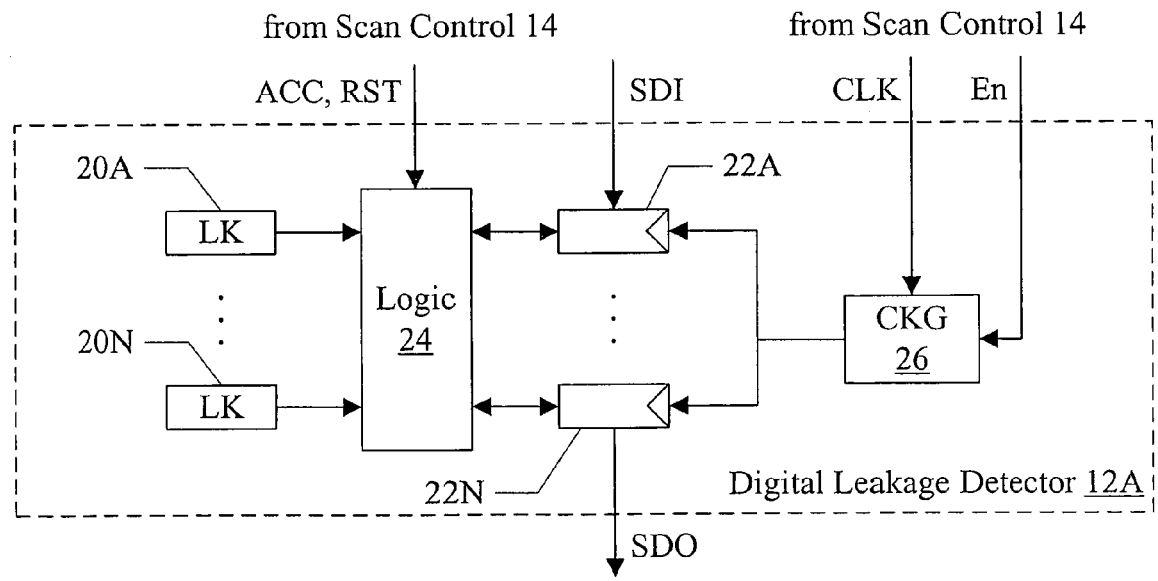
FIG. 2 is a block diagram of one embodiment of a digital leakage detector.

Turning now to FIG. 2, a block diagram of one embodiment of the digital leakage detector 12A is shown. Other digital leakage detectors in the integrated circuit 10, if any, may be similar. In the embodiment of FIG. 2, the digital leakage detector 12A includes a plurality of leak circuits 20A-20N and a corresponding plurality of flops 22A-22N. Each flop 22A-22N is configured to store state sampled with respect to a respective one of the leak circuits 20A-20N. In the illustrated embodiment, logic 24 is coupled between the leak circuits 20A-20N and the flops 22A-22N. The logic 24 may be used to help implement one or more modes of the digital leak detection. The logic 24 is coupled to receive an accumulate (ACC) signal and a reset (RST) signal from the scan unit 14. The ACC signal may be asserted to indicate accumulate mode, and deasserted to indicate sample mode. The RST signal may be asserted to reset the flops 22A-22N in accumulate mode. In this embodiment, both the ACC and the RST signals are asserted in the high (logical one) state and deasserted in the low (logical zero) state. Other embodiments may define one or both signals to be asserted in the low (logical zero) state and deasserted in the high (logical one) state. The flop 22A may have an SDI input coupled to an external SDI signal (e.g. from one of the other digital leakage detectors 12B-12C). The flop 22N may have an SDO output to an external SDO output signal (e.g. to another digital leakage detector 12B-12C). Each flop 22A-22N is coupled to receive a clock signal from a clock generator (CKG) 26. The clock generator 26 may receive a clock (CLK) signal and an enable (En) signal, and may generate a clock responsive to the CLK signal and responsive to assertion of the En signal. The CLK signal may be a relatively low frequency clock signal (e.g. the scan clock) or may be the clock signal used for the core logic in the integrated circuit 10.

Each leak circuit 20A-20N may include at least two transistors (e.g. an NMOS and a PMOS). One of the transistors is active and the other is inactive according to the gate inputs to the transistors. The leak circuit 20A-20N may output a digital signal to the logic 24 (or directly to the respective flops 22A-22N if only the sample mode is implemented, in which case the logic 24 may be eliminated) indicative of whether the leakage current in the inactive transistor is comparable to the active current in the active transistor. For example, the signal may be a binary one to indicate comparable, or a binary zero to indicate not comparable. Other embodiments may invert the assignment of bit states to meanings.

Figure 3:
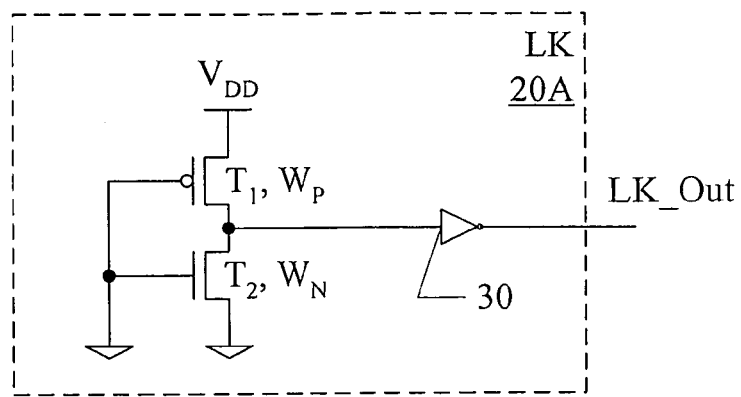
FIG. 3 is a block diagram of one embodiment of a leak circuit.

One embodiment of the leak circuit 20A is shown in FIG. 3. Other leak circuits may be similar. In the embodiment of FIG. 3, a PMOS transistor $T_1$, is shown, having a channel width denoted as $W_P$. An NMOS transistor $T_2$ is also shown, having a channel width denoted as $W_N$. The transistors $T_1$, and $T_2$ are coupled in an inverter configuration, with the input to the inverter (the gates of the transistors $T_1$, and $T_2$) grounded. The source of the transistor $T_1$ is coupled to the power supply voltage ($V_{DD}$) and the source of the transistor $T_2$ is coupled to ground ($V_{SS}$). The drains of the transistors $T_1$ and $T_2$ are coupled together and form the output of the inverter. The output of the inverter is the input to a second inverter 30, the output of which is the output of the leak circuit 20A (LK_Out in FIG. 3).

The leakage current of an inactive transistor tends to increase with the width parameter. Accordingly, by increasing the width parameter in the inactive transistor (transistor $T_2$ in the embodiment of FIG. 3) with respect to the width of the active transistor ($T_1$), the magnitude of the leakage current in the inactive transistor may be made to approach the magnitude of the active current in the active transistor. Thus, the leakage current magnitude may be approximated by setting the widths of the inactive transistors in each leak circuit 20A-20N to multiples of the width of the active transistor, and the actual leakage current magnitude for transistors having similar widths to the active transistors may be approximated.

Since the gates of the transistors $T_1$ and $T_2$ are grounded in FIG. 3, the transistor $T_1$ is active and the transistor $T_2$ is inactive. In the absence of leakage current, the output of the inverter formed from the transistors $T_1$ and $T_2$ is a logical one ($V_{DD}$), and the output of the inverter 30 is a logical zero. However, the leakage current in the transistor $T_2$ may reduce the voltage on the output node, considerably if the leakage current approximates the active current (e.g. within an order of magnitude). At a certain magnitude of the leakage current, relative to the active current in the transistor $T_1$, the voltage is reduced to the point that the inverter 30 changes stage on the output (LK_Out). The leakage current on the input of a logic gate causing a change of state in the output of the logic gate is referred to herein as the leakage current "overcoming" the active current. For example, if the inverter 30 is symmetrical on the input, such that the output may switch when the input voltage is approximately midway between $V_{DD}$ and ground, the inverter 30 may change state when the leakage current in the transistor $T_2$ is approximately equal to the active current in the transistor $T_1$. Thus, a logical one on the LK_Out signal indicates that the leakage current in $T_2$ is comparable to the active current of $T_1$. By correlating from the ratio of $W_N$ to $W_P$ and the active current magnitude, the leakage current magnitude may be estimated. That is, the width $W_N$ at which the leakage current overcomes the active current may be much larger than the width $W_P$ of the active transistor. To get an equivalent leakage current for a transistor having a width $W_N$ similar to the width $W_P$, scaling based on the width may be needed.

For a given set of leak circuits 20A-20N, the width $W_P$ of the transistor $T_1$ may be fixed and the width $W_N$ of the transistor $T_2$ may be varied for each leak circuit 20A-20N. The widths $W_N$ in the leak circuits 20A-20N may have a mathematical relationship to each other. The relationship may be linear, or non-linear (e.g. a logarithmic relationship). For example, in one embodiment, the widths may have a log base 2 relationship. That is, each width $W_N$ in the series of leak circuits 20A-20N may be twice the width $W_N$ of the previous circuit in the series. By using such non-linear relationships, a relatively wide range of leakage current magnitudes may be covered with relatively few leak circuits 20A-20N. More granularity in the range may be achieved by using more leak circuits 20A-20N, or by changing the relationship of the widths in the series of leak circuits 20A-20N. For example, in one embodiment, 12 leak circuits 20A-20B may be implemented and may have the log base 2 relationship. In such an embodiment, ratios of $W_N$ to $W_P$ from 1 ($W_N$32 $W_P$) to 4096, in multiples of 2, may be supported. Other multiples may be used in other embodiments.

In some embodiments, the transistor $T_1$ may actually be implemented as a "stack" of several transistors having an effective width of $W_P$. By shorting one or more of these transistors or otherwise rewiring the transistors, additional flexibility in the range of ratios supported by the digital leakage detector 12A may be gained.

In other embodiments, a similar circuit to the circuit 20A may be used to detect the leakage current of PMOS transistors. The gates of the transistors $T_1$, and $T_2$ may be tied to the power supply voltage ($V_{DD}$) instead of ground. The opposite sense of the LK_Out signal may be assigned as compared to the above description, or another inverter may be inserted in series with the inverter 30. The width $W_N$ of the transistor $T_2$ may be fixed, and the width $W_P$ of the transistor $T_1$, over the leak circuits 20A-20N may be varied with a relationship similar to that noted above.

It is noted that other embodiments of the leak circuit 20A may differ from the embodiment shown in FIG. 3. For example, any mechanism that determines the relative current magnitudes of the leakage and active currents may be used (e.g. analog current comparison, other types of logic gates than inverters, etc.). Various embodiments of the digital leakage detector 12A may implement varying amounts of analog circuitry, including completely analog leak detector embodiments.

Figure 4:
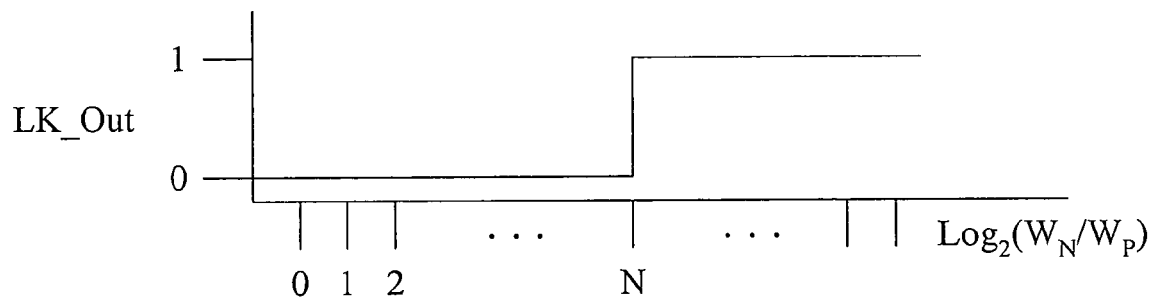
FIG. 4 is a graph illustrating an output from one embodiment of a set of leak circuits.

FIG. 4 is a graph is shown illustrating an output from one exemplary set of leak circuits 20A-20N similar to the embodiment shown in FIG. 3. The LK_Out signal is shown across each leak circuit 20A-20N, represented on the graph by the log (base 2) of the $W_N$ and $W_P$ parameters for that circuit. The LK_Out signal is shown at a logical zero for $\log_2(W_N/W_P)$ of 0, 1, 2, etc. up to N, where the LK_Out signal transitions to a logical one and remains a logical one for remaining lead circuits 20A-20N. Thus, the leakage current of the transistors in the integrated circuit 10 is between the leakage current that correlates to the leak circuit 20A-20N having $\log_2(W_N/W_P)$ of N and the leakage current that correlates to the leak circuit 20A-20N having $\log_2(W_N/W_P)$ of N-1. Accordingly, the magnitude of the leakage current in the integrated circuit 10 may be approximated.

Returning to FIG. 2, the outputs (LK_Out in FIG. 3) of the leak circuits 20A-20N are provided to the logic circuit 24, and are passed through by the logic circuit 24 in sample mode to the corresponding flops 22A-22N for storage. The flops 22A-22N may capture state responsive to the clock signals on the clock inputs of the flops 22A-22N. The flops 22A-22N may also provide signals indicating the stored state back to the logic circuit 24 for use in accumulate mode.

Figure 5:
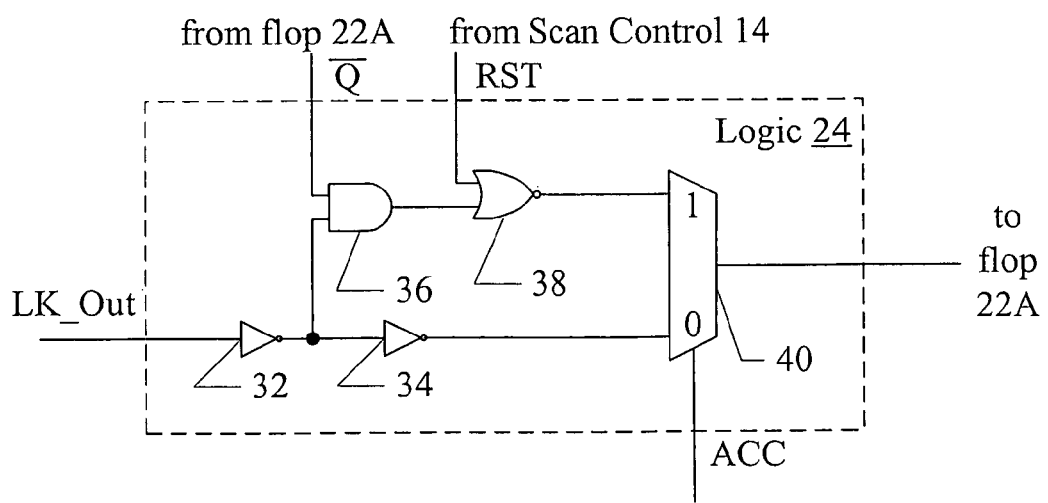
FIG. 5 is a block diagram of one embodiment of a portion of the logic circuit illustrated in FIG. 2.

Turning now to FIG. 5, a block diagram of one embodiment of a portion of the logic 24 corresponding to one leak circuit 20A is shown. Similar circuitry may be implemented in the logic circuit 24 for each other leak circuit. While specific logic circuitry is shown in FIG. 5, other embodiments may implement any desired logic circuitry, including any Boolean equivalents of the circuitry shown in FIG. 5.

The logic 24 in the embodiment of FIG. 5 includes inverters 32 and 34, an AND gate 36, a NOR gate 38, and a multiplexor (mux) 40. The LK_Out signal from the leak circuit 20A is coupled to the input of the inverter 32, the output of which is coupled to the input of the inverter 34, the output of which is coupled to the 0 input of the mux 40. The output of the inverter 32 is coupled to an input of the AND gate 36, which also receives the inverted output (Q Bar in FIG. 5) from the flop 22A. The output of the AND gate 36 is an input to the NOR gate 38, which has an input coupled to the RST signal and an output coupled to the 1 input of the mux 40. The output of the mux 40 is the input to the flop 22A, and the mux 40 receives the ACC signal as a select control from the scan control unit 14.

In sample mode, the scan control unit 14 deasserts the ACC signal and the 0 input of the mux 40 is selected. Thus, the LK_Out signal (propagated through the inverters 32 and 34) is sampled by the flop 22A.

In the accumulate mode, the scan control unit 14 asserts the ACC signal and the 1 input of the mux 40 is selected. Initially, the flop 22A is clear and thus the Q Bar signal is a logical one. If the LK_Out signal is a logical zero, the output of the inverter is a logical one and thus the output of the AND gate 36 is a logical one. The output of the NOR gate 38 is a logical zero, and the flop 22A remains clear.

If the LK_Out signal transitions to a logical one, the output of the inverter 32 becomes a logical zero and the output of the AND gate 36 becomes a logical zero. Assuming the RST signal is deasserted, the output of the NOR gate 38 is a logical one, and the flop 22A is set. The Q Bar signal from the flop 22A transitions to a logical zero, which ensures that the output of the AND gate 36 remains at a logical zero independent of the state of the LK_Out signal. The output of the NOR gate 38 thus remains at a logical one until the RST signal is asserted, which ensures that the flop 22A remains set. If the RST signal is asserted, the output of the NOR gate 38 is a logical zero and the flop 22A is cleared.

While the illustrated embodiment illustrates accumulating set states in the flops 22A-22N, other embodiments may accumulate clear states using a reset/settable mode. It is further noted that, in other embodiments, accumulate mode may be implemented using set/reset (SR) flops for the flops 22A-22N, instead of logic circuit 24 implementing the accumulate mode.

It is noted that, while the above example embodiments have used flops, other embodiments may implement any clocked storage device storage. Generally, a clocked storage device may include any storage device that is configured to sample an input or inputs responsive to a clock signal and to provide the sampled input as an output, in steady state, until the next sample is caused. Clocked storage devices may include flops, latches, registers, etc. It is noted that, while CMOS transistors are used as an example above, other embodiments may detect leakage currents in other types of transistors.

Figure 6:
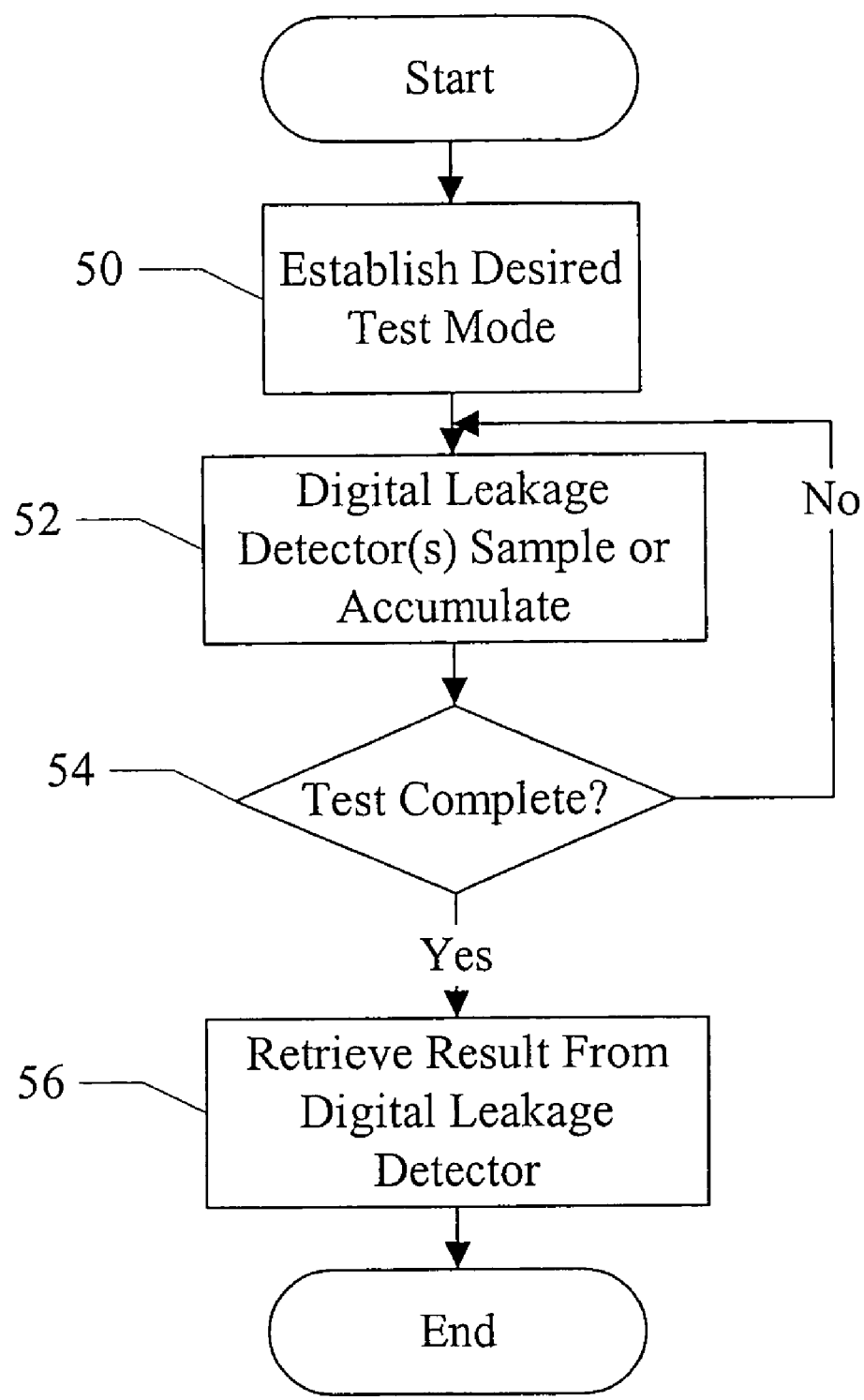
FIG. 6 is a flowchart illustrating one embodiment of a method of leakage current detection.

Turning now to FIG. 6, a flowchart is shown illustrating one embodiment of a method of leakage current detection. While the blocks are shown in a particular order for ease of understanding, other orders may be used.

The desired test mode in the digital leakage detectors 12A-12C may be established (block 50). In embodiments in which the digital leakage detectors 12A-12C have only one mode, block 50 may be eliminated. For example, in the present embodiment, accumulate or sample mode may be established. The mode may be established, e.g., by controlling the scan control unit 14 with the scan control signals to assert or deassert the ACC signal.

The digital leakage detectors 12A-12C may sample or accumulate the outputs of the leak circuits (block 52). If the test is not yet complete (decision block 54, "no" leg), the sampling or accumulating continues. For example, the test may not be completed if not enough time has elapsed for the digital leakage detectors 12A-12C to capture a sample. Alternatively, if the test involves varying other parameters such as temperature, supply voltage, etc., the test may not be complete if the variations have not been performed. If the test is complete (decision block 54, "yes" leg), the result may be retrieved from the digital leakage detector(s) 12A-12C (block 56). For example, the scan control unit 14 may scan the result out of the digital leakage detectors 12A-12C.

Numerous variations and modifications will become apparent to those skilled in the art once the above disclosure is fully appreciated. It is intended that the following claims be interpreted to embrace all such variations and modifications.

What is claimed is:

1. An integrated circuit comprising at least one digital leakage detector, the digital leakage detector comprising digital circuitry configured to approximate a magnitude of the leakage current in a transistor of the integrated circuit and configured to generate a digital output representing the approximated magnitude, and wherein the digital output comprises a vector of bits captured in parallel by the digital leakage detector, wherein each bit in the vector is associated with a different possible magnitude of the leakage current, and wherein each bit is indicative in a first one of a binary one state and a binary zero state that the magnitude of the leakage current exceeds the associated magnitude, and wherein each bit is indicative in a second one of the binary one state and the binary zero state that the magnitude of the leakage current does not exceed the associated magnitude, and wherein a location of a transition within the vector from binary zero to binary one is indicative of the magnitude of the leakage current, to a granularity supported by the digital leakage detector.

2. The integrated circuit as recited in claim 1 wherein the at least one digital leakage detector comprises a plurality of digital leakage detectors, and wherein a first digital leakage detector of the plurality of digital leakage detectors comprises transistors having a standard threshold voltage, and wherein a second digital leakage detector of the plurality of digital leakage detectors comprises transistors having a high threshold voltage relative to the standard threshold voltage, and wherein a third digital leakage detector of the plurality of digital leakage detectors comprises transistors having a low threshold voltage relative to the standard threshold voltage.

3. The integrated circuit as recited in claim 1 wherein the at least one digital leakage detector comprises a plurality of digital leakage detectors, and wherein a first digital leakage detector of the plurality of digital leakage detectors is configured to approximate leakage current in an N-type metal-oxide-semiconductor (NMOS) transistor, and wherein a second digital leakage detector of the plurality of digital leakage detectors is configured to approximate leakage current in a P-type MOS (PMOS) transistor.

4. An integrated circuit comprising at least one digital leakage detector, the digital leakage detector comprising digital circuitry configured to approximate a magnitude of the leakage current in a transistor of the integrated circuit and configured to generate a digital output representing the approximated magnitude, and wherein the digital circuitry comprises a plurality of leak circuits, wherein each of the plurality of leak circuits comprises a first transistor and a second transistor, and wherein a width parameter of the first transistor is a multiple of a width parameter of the second transistor, and wherein the multiple for each of the plurality of leak circuits is different from each other one of the plurality of leak circuits.

5. The integrated circuit as recited in claim 4 wherein the width parameters of the first transistors in the plurality of leak circuits have a logarithmic relationship to each other.

6. The integrated circuit as recited in claim 5 wherein the logarithmic relationship is base 2.

7. The integrated circuit as recited in claim 4 wherein each of the plurality of leak circuits is configured to drive an output signal representing a magnitude of a leakage current of the first transistor relative to an active current in the second transistor.

8. The integrated circuit as recited in claim 7 wherein the first and second transistors are configured as an inverter having an input tied to a voltage source.

9. The integrated circuit as recited in claim 8 wherein the first transistor is an N-type metal-oxide-semiconductor (NMOS) transistor, the second transistor is a P-type MOS (PMOS) transistor, and the input is tied to a ground voltage source.

10. The integrated circuit as recited in claim 8 wherein the second transistor is an N-type metal-oxide-semiconductor (NMOS) transistor, the first transistor is a P-type MOS (PMOS) transistor, and the input is tied to a power supply voltage source.

11. The integrated circuit as recited in claim 8 wherein each of the plurality of leak circuits further comprises a second inverter, and wherein an output of the inverter is the input of the second inverter.

12. The integrated circuit as recited in claim 11 wherein an output of the second inverter is the output signal, and the output of the second inverter is a first digital value if the leakage current in the first transistor does not overcome the active current in the second transistor, and wherein the output of the second inverter is a second digital value if the leakage current in the first transistor overcomes the active current in the second transistor.

13. The integrated circuit as recited in claim 7 wherein the digital circuitry further comprises a plurality of clocked storage devices, wherein each of the plurality of clocked storage devices corresponds to a respective one of the plurality of leak circuits and is configured to capture a state corresponding to the respective one of the plurality of leak circuits, and wherein the state of the plurality of clocked storage devices as a whole comprises the digital output of the digital leakage detector.

14. The integrated circuit as recited in claim 13 wherein the digital circuitry further comprises a logic circuit coupled between the plurality of leak circuits and the plurality of clocked storage devices, wherein the logic circuit is configured to receive the output signals of the plurality of leak circuits and provide the inputs to the plurality of clocked storage devices.

15. The integrated circuit as recited in claim 14 wherein the logic circuit is configured to provide a set/resettable mode and a sample mode for the plurality of clocked storage devices with respect to the outputs of the plurality of leak circuits.

16. A leak detector comprising:
   a plurality of leak circuits, each leak circuit configured to generate an output signal indicative of whether or not a magnitude of a leakage current in a transistor of an integrated circuit exceeds a magnitude associated with that leak circuit, wherein each leak circuit has a different associated magnitude; and
   a plurality of clocked storage devices configured to capture a state representing the output signals of the plurality of leak circuits.

17. The leak detector as recited in claim 16 wherein each of the plurality of leak circuits comprises a first transistor and a second transistor, and wherein a width parameter of the first transistor is equal to a multiple of a width parameter of the second transistor, and wherein the multiple for each of the plurality of leak circuits is different from each other one of the plurality of leak circuits, and wherein the output signal of a given leak circuit represents a magnitude of a leakage current of the first transistor relative to an active current in the second transistor.

18. The leak detector as recited in claim 17 wherein the first and second transistors are configured as an inverter having an input tied to a relatively constant voltage.

19. The leak detector as recited in claim 18 wherein each of the plurality of leak circuits further comprises a second inverter, and wherein an output of the inverter is the input of the second inverter, and wherein an output of the second inverter is a first digital value if the leakage current in the first transistor does not overcome the active current in the second transistor, and wherein an output of the second inverter is a second digital value if the leakage current in the first transistor overcomes the active current in the second transistor.

20. The leak detector as recited in claim 16 further comprising a logic circuit coupled between the plurality of leak circuits and the plurality of clocked storage devices, wherein the logic circuit is configured to receive the output signals of the plurality of leak circuits and provide the inputs to the plurality of clocked storage devices.

21. The leak detector as recited in claim 20 wherein the logic circuit is configured to provide a set/resettable mode and a sample mode for the plurality of clocked storage devices with respect to the output signals of the plurality of leak circuits.

* * * * *